(12) United States Patent
Parkhurst

(10) Patent No.: US 6,784,736 B2
(45) Date of Patent: Aug. 31, 2004

(54) APPARATUS AND METHOD FOR INDICATING A DIFFERENCE BETWEEN FIRST AND SECOND VOLTAGE SIGNALS

(75) Inventor: Charles Parkhurst, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/292,146

(22) Filed: Nov. 12, 2002

(65) Prior Publication Data

US 2004/0090270 A1 May 13, 2004

(51) Int. Cl.[7] ................................................. H03F 3/45
(52) U.S. Cl. ..................................... 330/255; 330/263
(58) Field of Search ............................... 330/255, 262, 330/263, 267, 257

(56) References Cited

U.S. PATENT DOCUMENTS 5,512,859 A * 4/1996 Moraveji ................... 330/255
6,542,032 B2 * 4/2003 Escobar-Bowser et al. . 330/255

* cited by examiner

*Primary Examiner*—Khanh Van Nguyen
(74) *Attorney, Agent, or Firm*—W. Daniel Swayze, Jr.; W. James Brady; Frederick J. Telecky, Jr.

(57) ABSTRACT

An apparatus for indicating a difference between a first voltage and a second voltage includes: (a) an input unit for receiving the first voltage at a first locus and receiving the second voltage at a second locus; the input unit quanitifying the difference; (b) an output unit coupled with the input unit and cooperating with the input unit to generate an output signal for effecting the indicating; and (c) a signal treating unit coupled with the output unit, the first locus and the second locus, and employing at least one algorithmic relation with at least one of the first voltage and the second voltage to generate at least one bias current for effecting a substantially balanced response by said output section in said generating said output signal as said difference varies. The at least one drive current has nonnegative values as the difference ranges in value.

16 Claims, 3 Drawing Sheets

APPARATUS AND METHOD FOR INDICATING A DIFFERENCE BETWEEN FIRST AND SECOND VOLTAGE SIGNALS

BACKGROUND OF THE INVENTION

The present invention is directed to an apparatus and method for indicating a difference between a first voltage input signal and a second voltage input signal, such as operational amplifiers for indicating differences between two voltages.

Analog circuits often have need for high-speed operational amplifiers (also known as op amps) that are capable of transmitting signals with little distortion caused by the op amp itself. There are known op amp architectures that are suitable for high-speed applications. Two common such high-speed op amp architectures are current feedback op amps and class AB op amps. These two representative op amp architectures use a common output stage that has been proven useful because of its wide bandwidth and low distortion performance.

Some output stages for op amps exhibit an exponential relationship between the output signals produced by those output stages and the voltage signals applied to an associated input stage. An example of an op amp output stage exhibiting such an exponential relationship is a type of output stage known as a dynamic diamond driver output stage. The exponential relationship means that the higher a differential voltage across the inputs of the op amp, the higher will be the current applied for charging and discharging a compensation capacitor at the high impedance node of the output stage. Such a relationship is desirable because it increases the slew rate of the op amp, which is manifested in the further benefit of decreasing distortion. Employing such a dynamic diamond driver output stage in an op amp provides benefits in increasing speed of the transistors on the signal path and provides higher driving capability. The speed increase is manifested as improved linearity and consequent lower distortion. Higher current driving capability eliminates distortion products due to driving limitations, such as turning off one of the pre-divers when heavy loads are required.

The dynamic diamond driver has a significant disadvantage of asymmetry with respect to the input signal. This occurs because the biasing current going into the pre-driver transistors is only going to increase when the signal is passing through them. While one signal path is very fast, the other signal path is very slow, and this disparity in speed causes distortion when the output signal changes from a negative value to a positive value.

Speed in the output stage pre-driver transistors of an op amp is important in circuits requiring high-speed, low distortion performance because those transistors are directly connected to the high impedance node of the output stage where most of the distortion is created. If one of the pre-drivers has less current during a signal transition the overall speed of the amplifier is decreased between signal transitions, thereby causing undesirable distortion products. These distortion products occur during signal transitions principally because once a bipolar transistor is near turning off, it takes an unacceptably long time to turn it back on again.

There is a need for an apparatus and method for indicating a difference between a first voltage signal and a second voltage signal, such as an op amp, that performs symmetrically during signal transitions.

SUMMARY OF THE INVENTION

An apparatus for indicating a difference between a first voltage and a second voltage includes: (a) an input unit for receiving the first voltage at a first locus and receiving the second voltage at a second locus; the input unit quanitifying the difference; (b) an output unit coupled with the input unit and cooperating with the input unit to generate an output signal for effecting the indicating; and (c) a signal treating unit coupled with the output unit, the first locus and the second locus, and employing at least one algorithmic relation with at least one of the first voltage and the second voltage to generate at least one bias current for effecting a substantially balanced response by the output section in generating the output signal as the difference varies. The at least one bias current has nonnegative values as the difference ranges in value.

A method for indicating a difference between a first voltage and a second voltage includes the steps of: (a) in no particular order: (1) providing an input unit for receiving the first voltage at a first locus and receiving the second voltage at a second locus; the input unit being configured for quanitifying the difference; (2) providing an output unit coupled with the input unit; the output unit being configured for cooperating with the input unit to generate an output signal; the output signal effecting the indicating; and (3) providing a signal treating unit coupled with the output unit, coupled with the first locus and coupled with the second locus; and (b) operating the signal treating unit employing at least one algorithmic relation with the first voltage and with the second voltage to generate at least one bias current for effecting a substantially balanced response by the output section in generating the output signal as the difference varies; the at least one bias current having nonnegative values as the difference ranges in value.

It is, therefore, an object of the present invention to provide an apparatus and method for indicating a difference between a first voltage signal and a second voltage signal that performs symmetrically during signal transitions.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The preferred embodiment of the invention solves the problem of operational asymmetry by bipolar transistors in an output stage or unit by ensuring that the biasing currents serving the bipolar transistors in the output stage increase no matter the polarity of the signal in transition. That is, to treat the biasing currents to ensure they do not take non-negative values during transitions of the input signals. The preferred embodiment of the invention establishes a hyperbolic cosine relationship between the input signals and the biasing currents.

Figure 1:
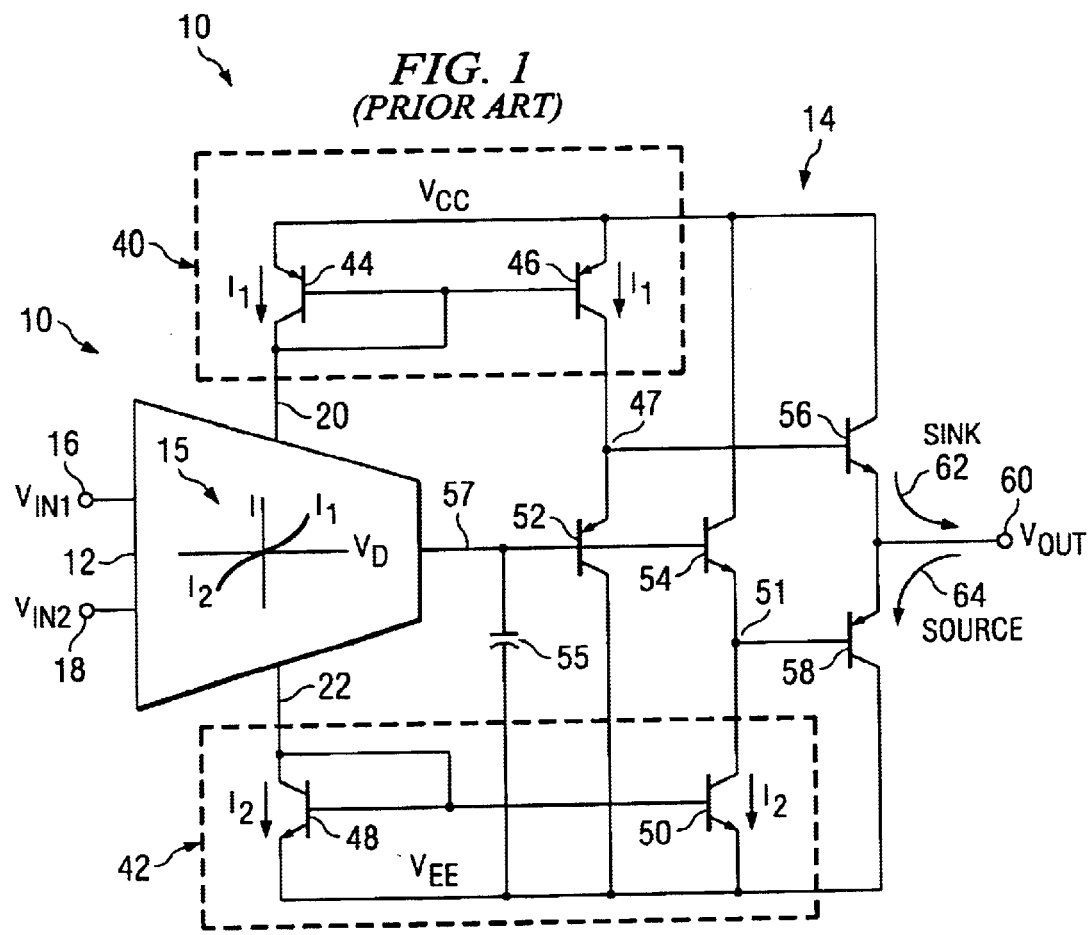
FIG. 1 is an electrical schematic diagram of a prior art apparatus for indicating a difference between a first voltage input signal and a second voltage input signal.

FIG. 1 is an electrical schematic diagram of a prior art apparatus for indicating a difference between a first voltage input signal and a second voltage input signal. In FIG. 1, an apparatus 10 for indicating a difference between a first voltage supply signal and a second voltage input supply signal (such as an op amp) includes a generic input stage 12 and an output stage 14. Input stage 12 receives a first voltage signal $V_{IN1}$ at a first input locus 16 and receives a second voltage signal $V_{IN2}$ at a second input locus 18.

Output stage 14 includes current mirrors 40, 42. Current mirror 40 includes bipolar transistors 44, 46 and current mirror 42 includes bipolar transistors 48, 50. Transistor 46 is employed in output stage 14 as an ON/OFF switch that switchingly controls electrical coupling of pre-driver bipolar transistor 52 with a voltage rail $V_{CC}$. Transistor 50 is employed in output stage 14 as an ON/OFF switch that switchingly controls electrical coupling pre-driver bipolar transistor 54 with a voltage rail $V_{EE}$. Each transistor pair 46, 52 and 50, 54 operates to ensure forceful turn-on of driver transistors 56, 58 when an output signal from input stage 2 appears at a high impedance node 57 that is appropriate for rendering transistors 52, 54 conducting. Driver transistors 56, 58 are coupled with an output locus 60. Driver transistor 56 provides a sink current path for output locus 60, as indicated by an arrow 62; driver transistor 58 provides a source current path for output locus 60, as indicated by an arrow 64. A compensation capacitor 55 is coupled with high impedance node 57 and with voltage rail $V_{EE}$.

Input stage 12 provides an interim output signal at high impedance node 57 that is related to differential voltage $V_D$, the difference between input signals $V_{IN1}$, $V_{IN2}$. Input stage 12 also provides bias current $I_1$ to current mirror 40 from a bias node 20 for biasing transistor 46 to establish bias current $I_1$ is applied to a node 47 to assure that transistor 52 is biased positively for solidly tuning on when the interim output signal at high impedance node 57 is appropriate for biasing pre-driver transistor 52 to effect completion of a circuit between voltage rails $V_{CC}$, $V_{EE}$ through transistors 46, 52 and thereby control biasing of driver transistor 56. Input stage 12 further provides bias current $I_2$ to current mirror 42 from a bias node 22 for biasing transistor 50 to establish bias current $I_2$ is applied to a node 51 to assure that transistor 54 is biased positively for solidly turning on when the interim output signal at high impedance node 57 is appropriate for biasing pre-driver transistor 54 to effect completion of a circuit between voltage rails $V_{CC}$, $V_{EE}$ through transistors 50, 54 and thereby control biasing of driver transistor 58.

It is noteworthy that input stage 12 generates bias currents $I_1$, $I_2$ asymmetrically, as indicated generally in a graph 15 in input stage 12. That is, as differential voltage $V_D$ varies positively (i.e., to the right in graph 15; FIG. 1), bias current $I_1$ varies between a zero value and a positive value. However, as differential voltage $V_D$ varies negatively (i.e., to the left in graph 15; FIG. 1), bias current 12 varies between a zero value and a negative value. Output stage 14 is configured substantially as a dynamic diamond driver. As mentioned earlier herein, dynamic diamond driver output stages have a significant disadvantage of asymmetry with respect to the input signals $V_{IN1}$, $V_{IN2}$. This occurs because biasing current $I_1$ going into the pre-driver transistor 52 is only going to increase when current $I_1$ is passing through transistor 52. Similarly, biasing current $I_2$ going into the pre-driver transistor 54 is only going to increase when current $I_2$ is passing through transistor 54. While one signal path is very fast, the other signal path is very slow, and this disparity in speed causes distortion when the output signal changes from a negative value to a positive value.

Speed in the output stage pre-driver transistors 52, 54 is important in circuits requiring high-speed, low distortion performance because transistors 52, 54 are directly connected to high impedance node 57 of output stage 14 where most of the distortion is created. If one of the pre-driver transistors 52, 54 has less current during a signal transition the overall speed of the amplifier is decreased between signal transitions, thereby causing undesirable distortion products. These distortion products occur during signal transitions principally because once a bipolar transistor (e.g., one of pre-driver transistors 52, 54) is near turning off, it takes an unacceptably long time to turn it back on again.

Output stage 14 thus includes two pre-driver transistors 52, 54, two driver transistors 56, 58 and two current source transistors 46, 50. The quiescent DC (direct current) bias point for output stage 14 is determined by applying the translinear principle:

$$\frac{I_{C56}}{A_{56}} \cdot \frac{I_{C58}}{A_{58}} = \frac{I_{C52}}{A_{52}} \cdot \frac{I_{C54}}{A_{54}} \quad [1]$$

where, $I_{cnn}$ is collector current for transistor nn, and $A_{nn}$ is area of transistor nn.

The size (area) of respective transistors is determined by the maximum current that output stage 14 needs to drive to a particular load. Usually the driver transistors are quite large so that they can withstand large amounts of current through them without exceeding the design gain ($\beta$) or maximum frequency, or bandwidth ($f_T$) of the transistor. Bias currents $I_1$, $I_2$ are determined by the driving requirements and gain of driver transistors 56, 58. The sizes of pre-driver transistors 52, 54 are determined by the bandwidth of transistors 52, 54 and the maximum quiescent current allowed in the op amp in which the output stage is employed. Ideally, pre-driver transistors 52, 54 should be small so that they do not contribute parasitic capacitance to high impedance node 57. In reality, pre-driver transistors 52, 54 cannot be configured as small as desired because the smaller that pre-driver transistors 52, 54 are, the more quiescent current will flow through driver transistors 56, 58. This result is apparent from inspecting Equation [1].

During relatively large signal transitions, currents emanating from current source transistors 46, 50 will be described by the relationships:

$$I_{C46} = I_q \cdot e^{\frac{V_D}{V_T}} \quad [2]$$

$$I_{C50} = I_q \cdot e^{\frac{-V_D}{V_T}} \quad [3]$$

Where, $I_{cnn}$ is the collector current for transistor nn,

Iq is the quiescent biasing current, $V_D$ is the differential voltage (see equation [4] below), and $V_T$ is the thermal voltage of the bipolar transistor.

$$V_D = V_{IN1} - V_{IN2} \quad [4]$$

Note from Equations [2] and [3] that currents through current source transistors 46, 50 are oppositely signed (note opposite polarity of powers of e). This results in an operational result that when one of transistors 46, 50 is conducting substantial amounts of current, the other of transistors 46, 50 is conducting very little. This operational situation directly affects the bandwidth of driver transistors 56, 58.

The general relationship between current and speed in a bipolar transistor may be expressed as:

$$f_T = \frac{1}{2\pi V_T}\left(\frac{I_c}{C_\pi + C_\mu}\right) \quad [5]$$

Where, $I_C$ is collector current, and $C_\pi$ and $C_\mu$ are parasitic junction capacitances in the transistor.

Equation [5] is valid only to a certain collector current. If too much collector current id applied to a transistor, the $f_T$ will begin to decrease instead of increase. This behavior is caused by high level injection and Kirk effect at high collector currents. Combining Equations [2], [3] and [5] and assuming that biasing of transistors 46, 50 is at a reasonable level that permits transistors 46, 50 to operate outside the region at which $f_T$ rolls off at high differential voltages, yields:

$$f_{T46} = \frac{1}{2\pi V_T}\left(\frac{I_q \cdot e^{\frac{V_D}{V_T}}}{C_\pi + C_\mu}\right) \quad [6]$$

$$f_{T50} = \frac{1}{2\pi V_T}\left(\frac{I_q \cdot e^{\frac{-V_D}{V_T}}}{C_\pi + C_\mu}\right) \quad [7]$$

By inspecting Equations [6] and [7], one may observe that $f_T$ of transistors 46, 50 effectively depends directly upon differential voltage $V_D$, thereby making either pre-driver transistor 52 very fast and pre-driver transistor 54 very slow or making either pre-driver transistor 52 very slow and pre-driver transistor 54 very fast. This phenomenon causes distortion products because of the decrement of $f_T$ of one of transistors 46, 50 during signal transition.

The solution effected by the present invention is to ensure that $I_{C46}$ and $I_{C50}$ increase at the same time no matter the polarity of differential voltage $V_D$. This solution eliminates the asymmetric behavior of pre-driver transistors 52, 54 with respect to differential voltage $V_D$, resulting in a more linear and a faster output stage, that is a lower distortion output stage.

Figure 2:
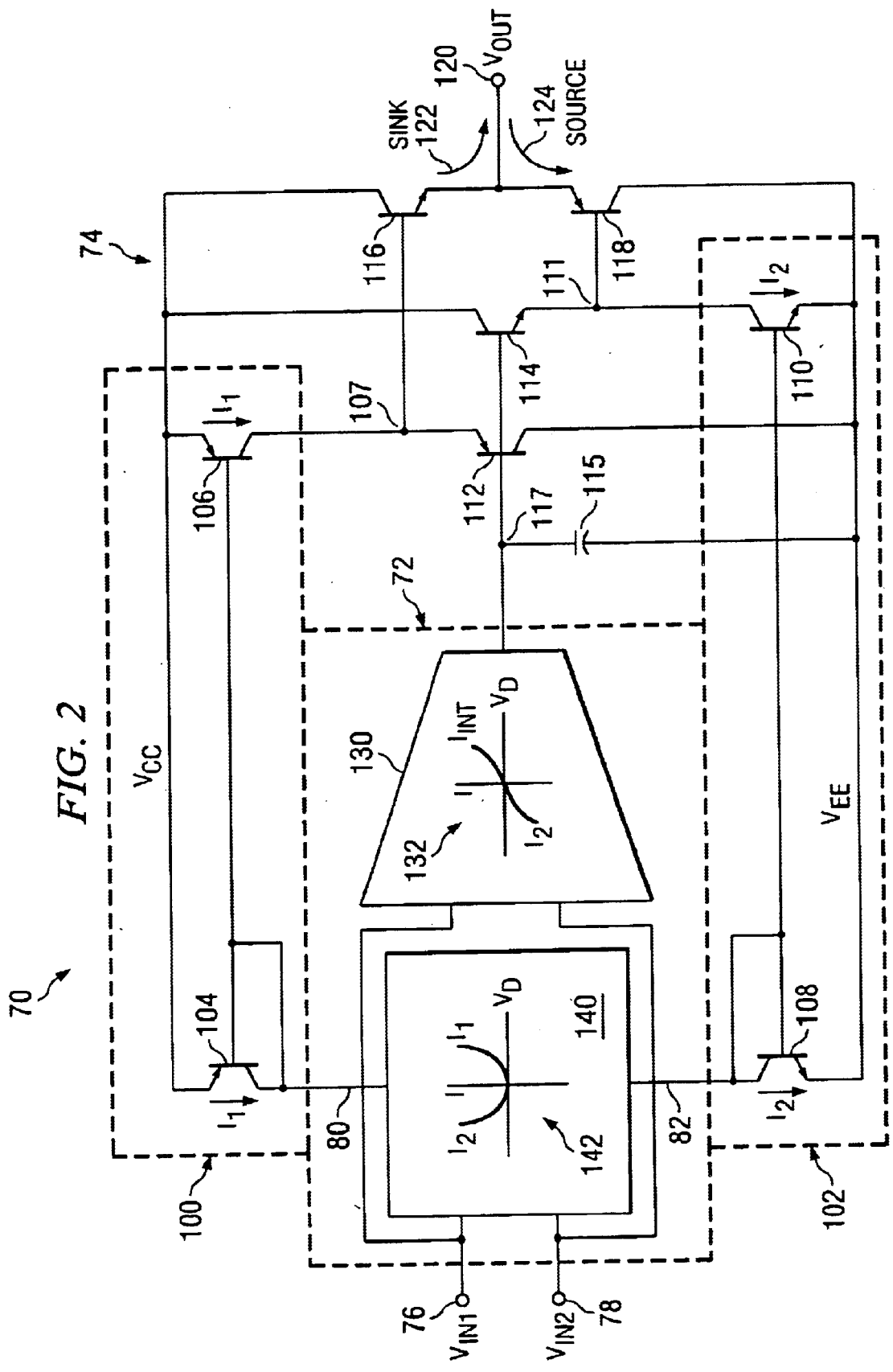
FIG. 2 is an electrical schematic diagram of an apparatus for indicating a difference between a first voltage input signal and a second voltage input signal according to the present invention.

FIG. 2 is an electrical schematic diagram of an apparatus for indicating a difference between a first voltage input signal and a second voltage input signal according to the present invention. In FIG. 2, an apparatus 70 for indicating a difference between a first voltage supply signal and a second voltage input supply signal (such as an op amp) includes an input stage 72 and an output stage 74.

Output stage 74 includes current mirrors 100, 102. Current mirror 100 includes bipolar transistors 104, 106 and current mirror 102 includes bipolar transistors 108, 110. Transistor 106 is employed in output stage 74 as an ON/OFF switch that switchingly controls electrical coupling of pre-driver bipolar transistor 112 with a voltage rail $V_{CC}$. Transistor 110 is employed in output stage 74 as an ON/OFF switch that switchingly controls electrical coupling pre-driver bipolar transistor 114 with a voltage rail $V_{EE}$. Each transistor pair 106, 112 and 110, 114 operates to ensure forceful turn-on of driver transistors 116, 118 when an output signal from input stage 72 appears at a high impedance node 117 that is appropriate for rendering transistors 112, 114 conducting. Driver transistors 116, 118 are coupled with an output locus 120. Driver transistor 116 provides a sink current path for output locus 120, as indicated by an arrow 122; driver transistor 118 provides a source current path for output locus 120, as indicated by an arrow 124. A compensation capacitor 115 is coupled with high impedance node 117 and with voltage rail $V_{EE}$.

Input stage 72 provides an interim output signal at high impedance node 117 that is related to differential voltage $V_D$, the difference between input signals $V_{IN1}$, $V_{IN2}$. Input stage 72 also provides bias current $I_1$ to current mirror 100 from a bias node 80 for biasing transistor 106 to establish bias current $I_1$ is applied to a node 107 to assure that transistor 112 is biased positively for solidly turning on when the interim output signal at high impedance node 117 is appropriate for biasing pre-driver transistor 112 to effect completion of a circuit between voltage rails $V_{CC}$, $V_{EE}$ through transistors 106, 112 and thereby control biasing of driver transistor 116. Input stage 72 fuither provides bias current $I_2$ to current mirror 102 from a bias node 82 for biasing transistor 1 10 to establish bias current $I_2$ is applied to a node 111 to assure that transistor 114 is biased positively for solidly turning on when the interim output signal at high impedance node 117 is appropriate for biasing pre-driver transistor 114 to effect completion of a circuit between voltage rails $V_{CC}$, $V_{EE}$ through transistors 110, 114 and thereby control biasing of driver transistor 118.

Input stage 72 includes an input section 130 and a signal treating section 140. Input section 130 is similar with input stage 12 (FIG. 1) in that input section 130 receives a first voltage signal $V_{IN1}$ at a first input locus 76 and receives a second voltage signal $V_{IN2}$ at a second input locus 78. Input section 130 employs input voltage signals $V_{IN1}$, $V_{IN2}$ to establish an operating current or currents for internal use within input section 130. Details of circuitry for this function are not illustrated in FIG. 2. What is worthy of note is that input section 130 generates internal current or currents $I_{INT}$ asynmmetrically, as indicated generally in a graph 132 in input section 130. That is, as differential voltage $V_D$ varies positively (i.e., to the right in graph 132; FIG. 2), internal current $I_{INT}$ varies between a zero value and a positive value. However, as differential voltage $V_D$ varies negatively (i.e., to the left in graph 132; FIG. 2), internal current $I_{INT}$ varies between a zero value and a negative value. Output stage 74 is configured substantially as a dynamic diamond driver. As discussed earlier herein in connection with describing FIG. 1, dynamic diamond driver output stages have a significant disadvantage of asymmetry with respect to the input signals $V_{IN1}$, $V_{IN2}$.

This disadvantage is significantly reduced or eliminated by using signal treating section 140 to provide bias currents for output stage 74. Signal treating section 140 is coupled with input loci 76, 78 so that signal treating section 140 also receives input signals $V_{IN1}$, $V_{IN2}$. Signal treating section 140 treats input signals $V_{IN1}$, $V_{IN2}$ according to an algorithmic relationship that generates bias currents $I_1$, $I_2$ at bias nodes 80, 82 in a manner whereby bias currents $I_1$, $I_2$ are ever greater than zero as differential voltage $V_D$ varies. The described relationship between bias currents $I_1$, $I_2$ and differential voltage $V_D$ is illustrated in a graph 142 in signal treating section 140. Thus, signal treating section 140 generates bias currents $I_1$, $I_2$ symmetrically, as indicated generally in graph 142 in input section 140. That is, as differential voltage $V_D$ varies positively (i.e., to the right in graph 142; FIG. 2), bias current $I_1$ varies between a zero value and a positive value. Further, as differential voltage $V_D$ varies negatively (i.e., to the left in graph 142; FIG. 2), bias current $I_2$ also varies between a zero value and a positive value.

Apparatus 70 employs a fully symmetrical output stage 74 embodied in a representative fully symmetric dynamic diamond driver. Signal treating section 140 is preferably embodied in a hyperbolic cosine function block to relate differential voltage $V_D$ and bias currents $I_1$, $I_2$ in a hyperbolic cosine relationship:

$$I_1, I_2 = f(\cosh V_D) \quad [8]$$

The effect of establishing such a relationship is to make bias currents $I_1$, $I_2$ increase in a symmetric manner with respect to differential voltage $V_D$.

Figure 3:
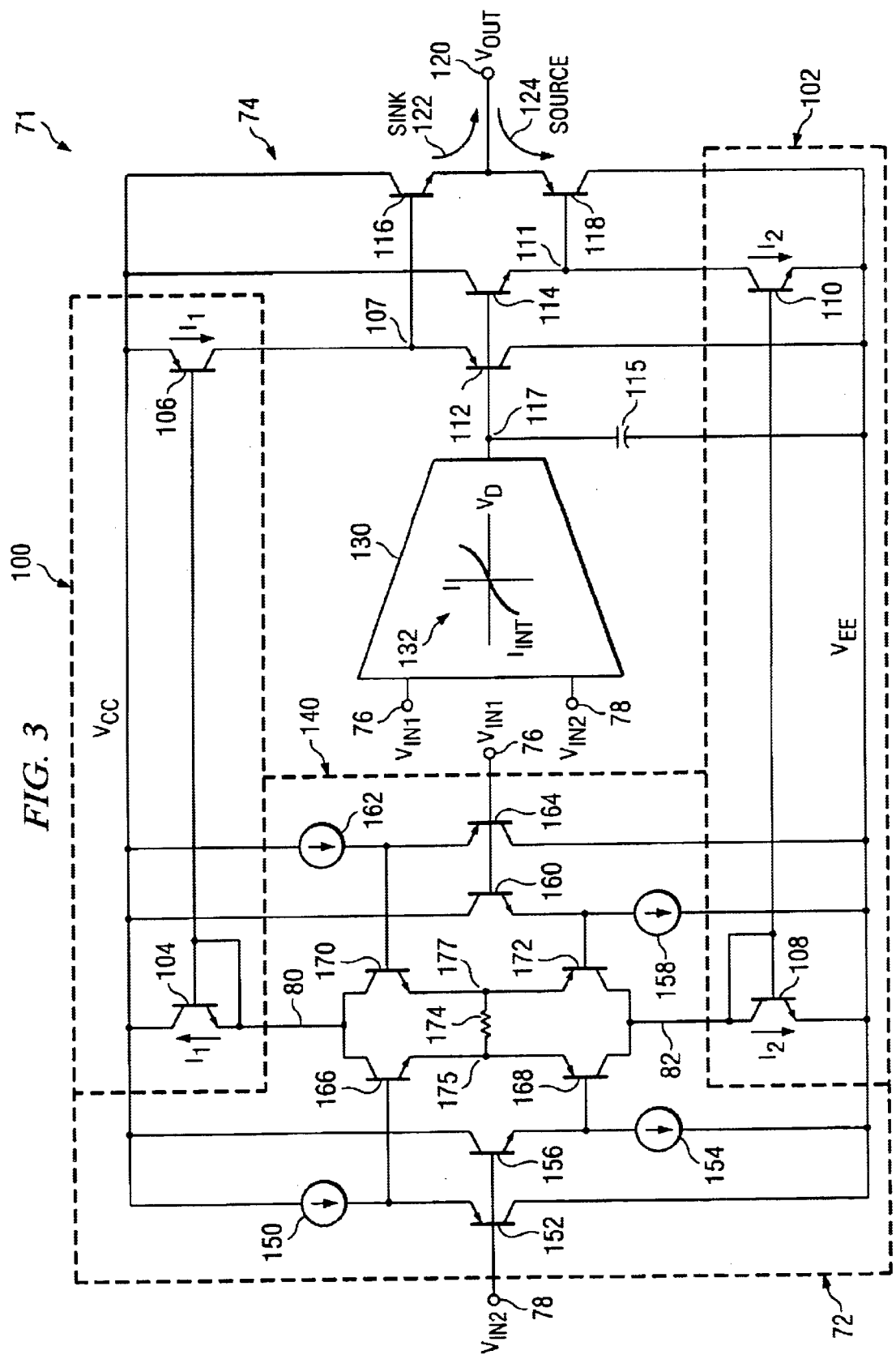
FIG. 3 is an electrical schematic diagram of an apparatus for indicating a difference between a first voltage input signal and a second voltage input signal according to the present invention showing the signal treating unit in greater detail.

FIG. 3 is an electrical schematic diagram of an apparatus for indicating a difference between a first voltage input signal and a second voltage input signal according to the present invention showing the signal treating unit in greater detail. In FIG. 3, an apparatus 71 for indicating a difference between a first voltage supply signal and a second voltage input supply signal (such as an op amp) is substantially similar with apparatus 70 (FIG. 2). Apparatus 71 includes an input stage 72 and an output stage 74.

Output stage 74 includes current mirrors 100, 102. Current mirror 100 includes bipolar transistors 104, 106 and current mirror 102 includes bipolar transistors 108, 110. Transistor 106 is employed in output stage 74 as an ON/OFF switch that switchingly controls electrical coupling of pre-driver bipolar transistor 112 with a voltage rail $V_{CC}$. Transistor 110 is employed in output stage 74 as an ON/OFF switch that switchingly controls electrical coupling pre-driver bipolar transistor 114 with a voltage rail $V_{EE}$. Each transistor pair 106, 112 and 110, 114 operates to ensure forceful turn-on of driver transistors 116, 118 when an output signal from input stage 72 appears at a high impedance node 117 that is appropriate for rendering transistors 112, 114 conducting. Driver transistors 116, 118 are coupled with an output locus 120. Driver transistor 116 provides a sink current path for output locus 120, as indicated by an arrow 122; driver transistor 118 provides a source current path for output locus 120, as indicated by an arrow 124. A compensation capacitor 115 is coupled with high impedance node 117 and with voltage rail $V_{EE}$.

Input stage 72 provides an interim output signal at high impedance node 117 that is related to differential voltage $V_D$, the difference between input signals $V_{IN1}$, $V_{IN2}$. Input stage 72 also provides bias current $I_1$ to current mirror 100 from a bias node 80 for biasing transistor 106 to establish bias current $I_1$ is applied to a node 107 to assure that transistor 112 is biased positively for solidly turning on when the interim output signal at high impedance node 117 is appropriate for biasing pre-driver transistor 112 to effect completion of a circuit between voltage rails $V_{CC}$, $V_{EE}$ through transistors 106, 112 and thereby control biasing of driver transistor 116. Input stage 72 further provides bias current 12 to current mirror 102 from a bias node 82 for biasing transistor 110 to establish bias current 12 is applied to a node 111 to assure that transistor 114 is biased positively for solidly turning on when the interim output signal at high impedance node 117 is appropriate for biasing pre-driver transistor 114 to effect completion of a circuit between voltage rails $V_{CC}$, $V_{EE}$ through transistors 110, 114 and thereby control biasing of driver transistor 118.

Input stage 72 includes an input section 130 and a signal treating section 140. Input section 130 is similar with input stage 12 (FIG. 1) in that input section 130 receives a first voltage signal $V_{IN1}$, at a first input locus 76 and receives a second voltage signal $V_{IN2}$ at a second input locus 78. Input section 130 employs input voltage signals $V_{IN1}$, $V_{IN2}$ to establish an operating current or currents for internal use within input section 130. Details of circuitry for this function are not illustrated in FIG. 2. What is worthy of note is that input section 130 generates internal current or currents $I_{INT}$ asymmetrically, as indicated generally in a graph 132 in input section 130. That is, as differential voltage $V_D$ varies positively (i.e., to the right in graph 132; FIG. 2), internal current $I_{INT}$ varies between a zero value and a positive value. However, as differential voltage $V_D$ varies negatively (i.e., to the left in graph 132; FIG. 2), internal current $I_{INT}$ varies between a zero value and a negative value. Output stage 74 is configured substantially as a dynamic diamond driver. As discussed earlier herein in connection with describing FIG. 1, dynamic diamond driver output stages have a significant disadvantage of asymmetry with respect to the input signals $V_{IN1}$, $V_{IN2}$.

This disadvantage is significantly reduced or eliminated by using signal treating section 140 to provide bias currents for output stage 74. Signal treating section 140 is coupled with input loci 76, 78 so that signal treating section 140 also receives input signals $V_{IN1}$, $V_{IN2}$. Signal treating section 140 treats input signals $V_{IN1}$, $V_{IN2}$ according to an algorithmic relationship that generates bias currents $I_1$, $I_2$ at bias nodes 80, 82 in a manner whereby bias currents 11, 12 are ever greater than zero as differential voltage $V_D$ varies. The described relationship between bias currents $I_1$, $I_2$ and differential voltage $V_D$ is illustrated in a graph 142 in signal treating section 140. Thus, signal treating section 140 generates bias currents $I_1$, $I_2$ symmetrically, as indicated generally in graph 142 in input section 140. That is, as differential voltage $V_D$ varies positively (i.e., to the right in graph 142; FIG. 2), bias current $I_1$ varies between a zero value and a positive value. Further, as differential voltage $V_D$ varies negatively (i.e., to the left in graph 142; FIG. 2), bias current $I_2$ also varies between a zero value and a positive value.

Signal treating section 140 is embodied in a hyperbolic cosine function circuit that receives input signals $V_{IN1}$, $V_{IN2}$ and generates output bias currents $I_1$, $I_2$ as hyperbolic cosine functions of input signals $V_{IN1}$, $V_{IN2}$, as described briefly in connection with equation [5] above. Signal treating circuit 140 includes a current source 150 coupled in series with a transistor 152. Transistor 152 responds to input signal $V_{IN2}$ to switchingly control current connection of current source 150 between voltage rails $V_{CC}$, $V_{EE}$. Signal treating circuit 140 also includes a current source 154 coupled in series with a transistor 156. Transistor 156 responds to input signal $V_{IN2}$ to switchingly control connection of current source 154 between voltage rails $V_{CC}$, $V_{EE}$. Signal treating circuit 140 further includes a current source 158 coupled in series with a transistor 160. Transistor 160 responds to input signal $V_{IN1}$ to switchingly control connection of current source 158 between voltage rails $V_{CC}$, $V_{EE}$. Signal treating circuit 140 still further includes a current source 162 coupled in series with a transistor 164. Transistor 164 responds to input signal $V_{IN1}$ to switchingly control connection of current source 162 between voltage rails $V_{CC}$, $V_{EE}$.

Transistors 166, 168 are coupled in series between bias nodes 80, 82. Transistors 170, 172 are also coupled in series between bias nodes 80, 82 and in parallel with transistors 166, 168. A resistor 174 is coupled between junctions 175, 177. Junction 175 is between transistors 166, 168; junction 177 is between transistors 170, 172. Transistor 166 is biased by current source 150 and transistor 152. Transistor 168 is biased by current source 154 and transistor 156. Transistor 170 is biased by current source 162 and transistor 164. Transistor 172 is biased by current source 158 and transistor 160.

Signal treating circuit 140 is a hyperbolic cosine function circuit block. Output bias currents $I_1$, $I_2$ are manifested as collector currents of transistors 106, 110 (i.e., $I_{C106}$, $I_{C110}$). Inspecting FIG. 3 reveals that output bias currents $I_{C106}$, $I_{C110}$ and differential voltage $V_D$ are related by the mathematical approximations:

$$I_{C106} \approx 2 \cdot Iq\cosh\left(\frac{V_D - (I_{C166} - I_{C170})R}{V_T}\right) \quad [9]$$

$$I_{C110} \approx 2 \cdot Iq\cosh\left(\frac{V_D - (I_{C168} - I_{C172})R}{V_T}\right) \quad [10]$$

Where, $I_{Cnnn}$ is the collector current of transistor nnn,
$I_q$ is quiescent bias current, and
R is the value of resistor 174.

Combining Equations [5], [9] and [10] provides determination of $f_t$ for transistors 106, 110:

$$f_{T106} = \frac{1}{\pi V_T}\left(\frac{I_q\cosh\left(\frac{V_D - (I_{C166} - I_{C170})R}{V_T}\right)}{C_\pi + C_\mu}\right) \quad [11]$$

$$f_{T110} = \frac{1}{\pi V_T}\left(\frac{I_q\cosh\left(\frac{V_D - (I_{C168} - I_{C172})R}{V_T}\right)}{C_\pi + C_\mu}\right) \quad [12]$$

An important feature of apparatus 71 that can be observed from inspecting Equations [11] and [12] is that $f_T$ for each of transistors 106, 110 always increases with differential voltage $V_D$. The amount of increase in biasing currents $I_{C106}$, $I_{C110}$ is controlled by the value R of resistor 174. This provides an easy straightforward ability to set the value of bias currents $I_{C106}$, $I_{C110}$ associated with a particular differential voltage $V_D$. Driver transistors 116, 118 will source or sink current to a load (not shown in FIG. 3) depending on the signal at high impedance node 117, and not depending on biasing currents $I_{C106}$, $I_{C110}$.

Figure 4:
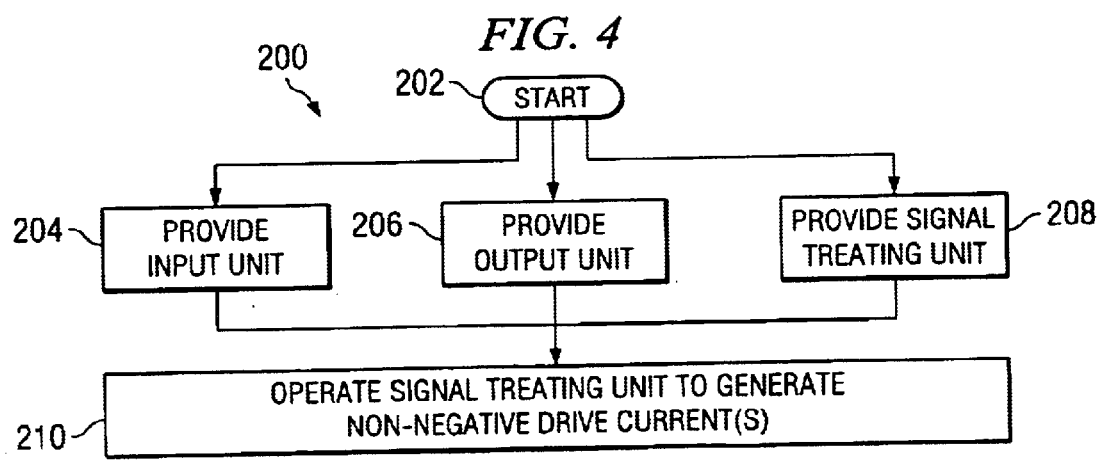
FIG. 4 is a flow chart illustrating the method of the present invention.

FIG. 4 is a flow chart illustrating the method of the present invention. In FIG. 4, a method 200 for indicating a difference between a first voltage input signal and a second voltage input signal begins at a START locus 202. Method 200 continues with, (a) in no particular order, (1) providing an input unit for receiving the first voltage input signal at a first input locus and receiving the second voltage input signal at a second input locus, as indicated by a block 204, the input unit being configured for quantifying the difference; (2) providing an output unit coupled with the input unit, as indicated by a block 206, the output unit being configured for cooperating with the input unit to generate an output signal, the output signal effecting the indicating; and (3) providing a signal treating unit coupled with the output unit, coupled with the first input locus and coupled with the second input locus, as indicated by a block 208. Method 200 continues with (b) operating the signal treating unit employing at least one algorithmic relation with the first voltage input signal and with the second voltage input signal to generate at least one bias current for effecting a substantially balanced response by the output section in the generating the output signal as the difference varies, as indicated by a bock 210. The at least one bias current has nonnegative values as the difference ranges in value.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

What is claimed is:

1. An operational amplifier apparatus comprising;
   (a) an input section; said input section receiving a first voltage input signal at a first input locus and receiving a second voltage input signal at a second input locus;
   (b) an output section coupled with said input section; said output section cooperating with said input section to generate an output signal at an output locus; said output signal being related to a difference between said first voltage input signal and said second voltage input signal;
   (c) a signal treating section coupled with said first input locus, coupled with said second input locus and coupled with said output section; said signal treating section generating at least one bias current as a function of said first voltage input signal and said second voltage input signal; said at least one bias current being ever greater than or equal with zero; said at least one bias current effecting a substantially balanced response by said output section in said generating said output signal as said difference varies; and
   (d) a symmetrical signal treating section connected with said signal treating section and said output section to provide a first bias current and a second bias current for said output section; said first bias current being symmetrically balanced with said second bias current.

2. An operational amplifier apparatus as recited in claim 1 wherein said output signal is comprised of contributing output signals from a first output device and a second output device coupled with said output locus; said at least one bias current effecting said substantially balanced response by establishing substantially equal bias levels for said first output device and said second output device.

3. An operational amplifier apparatus as recited in claim 1 wherein said signal treating section employs a hyperbolic cosine function with at least one voltage input signal of said first voltage input signal and said second voltage input signal in generating said at least one bias current.

4. An operational amplifier apparatus as recited in claim 2 wherein said signal treating section employs a hyperbolic cosine function with at least one voltage input signal of said first voltage input signal and said second voltage input signal in generating said at least one bias current.

5. An apparatus for indicating a difference between a first voltage input signal and a second voltage input signal; the apparatus comprising:
   (a) an input unit; said input unit receiving said first voltage input signal at a first input locus and receiving said second voltage input signal at a second input locus; said input unit quanitifying said difference;
   (b) an output unit coupled with said input unit; said output unit and said input unit cooperating to generate an output signal; said output signal effecting said indicating;
   (c) a signal treating unit coupled with said output unit, coupled with said first input locus and coupled with said second input locus; said signal treating unit employing at least one algorithmic relation with at least one of said first voltage input signal and said second voltage input signal to generate at least one bias current for effecting a substantially balanced response by said output section in said generating said output signal as said difference varies; said at least one bias current having nonnegative values as said difference varies; and d) a symmetrical signal treating unit connected with said signal treating and said output unit to provide a first bias current and a second bias current for said output unit, said first bias current being symmetrically balanced with said second bias current.

6. An apparatus for indicating a difference between a first voltage input signal and a second voltage input signal as recited in claim 5 wherein said algorithmic relation is a hyperbolic cosine relation.

7. An apparatus for indicating a difference between a first voltage input signal and a second voltage input signal as recited in claim 5 wherein said at least one bias current is two bias currents.

8. An apparatus for indicating a difference between a first voltage input signal and a second voltage input signal as recited in claim 5 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

9. An apparatus for indicating a difference between a first voltage input signal and a second voltage input signal as recited in claim 6 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

10. An apparatus for indicating a difference between a first voltage input signal and a second voltage input signal as recited in claim 7 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

11. A method for indicating a difference between a first voltage input signal and a second voltage input signal; the method including the steps of:
(a) in no particular order:
  (1) providing an input unit for receiving said first voltage input signal at a first input locus and receiving said second voltage input signal at a second input locus; said input unit being configured for quanitifying said difference;
  (2) providing an output unit coupled with said input unit; said output unit being configured for cooperating with said input unit to generate an output signal; said output signal effecting said indicating; and
  (3) providing a signal treating unit coupled with said output unit, coupled with said first input locus and coupled with said second input locus;
(b) operating said signal treating unit employing at least one algorithmic relation with said first voltage input signal and with said second voltage input signal to generate at least one bias current for effecting a substantially balanced response by said output section in said generating said output signal as said difference varies; said at least one bias current having nonnegative values as said difference ranges in value; and
(c) operating a symmetrical signal treating unit connected with said signal treating unit and said output unit to provide a first bias current and a second bias current for said output unit, said first bias current being symmetrically balanced with said second bias current.

12. A method for indicating a difference between a first voltage input signal and a second voltage input signal as recited in claim 11 wherein said algorithmic relation is a hyperbolic cosine relation.

13. A method for indicating a difference between a first voltage input signal and a second voltage input signal as recited in claim 11 wherein said at least one bias current comprises two bias currents.

14. A method for indicating a difference between a first voltage input signal and a second voltage input signal as recited in claim 11 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

15. A method for indicating a difference between a first input voltage signal and a second voltage input signal as recited in claim 12 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

16. A method for indicating a difference between a first input voltage signal and a second voltage input signal as recited in claim 13 wherein said output signal is comprised of contributing output signals from a first bipolar output transistor device and a second bipolar output transistor device, and wherein said effecting said substantially balanced response by said output unit comprises establishing substantially equal bias levels for said first bipolar output transistor device and said second bipolar output transistor device.

* * * * *